United States Patent
Mangaonkar et al.

(10) Patent No.: US 9,979,361 B1
(45) Date of Patent: May 22, 2018

(54) INPUT CIRCUITS FOR RF AMPLIFIER DEVICES, AND METHODS OF MANUFACTURE THEREOF

(71) Applicant: NXP USA, Inc., Austin, TX (US)

(72) Inventors: Sai Sunil Mangaonkar, Chandler, AZ (US); Ricardo Uscola, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/391,485

(22) Filed: Dec. 27, 2016

(51) Int. Cl.
| | | |
|---|---|---|
| H03F 3/191 | (2006.01) | |
| H03F 1/56 | (2006.01) | |
| H01L 23/66 | (2006.01) | |
| H03F 3/195 | (2006.01) | |
| H03F 3/213 | (2006.01) | |

(52) U.S. Cl.
CPC ............ *H03F 1/565* (2013.01); *H01L 23/66* (2013.01); *H03F 3/195* (2013.01); *H03F 3/213* (2013.01); *H01L 2223/6611* (2013.01); *H01L 2223/6672* (2013.01); *H03F 2200/225* (2013.01); *H03F 2200/451* (2013.01)

(58) Field of Classification Search
CPC ...................................................... H03F 3/191
USPC ................................................. 330/302, 305
See application file for complete search history.

(56) References Cited

U.S. PATENT DOCUMENTS

| | | | | |
|---|---|---|---|---|
| 6,054,902 A | * | 4/2000 | Masato ................. | H03F 3/1935 330/147 |
| 7,443,236 B2 | * | 10/2008 | Dow ........................ | H03F 1/14 330/129 |
| 8,076,994 B2 | | 12/2011 | Farrell et al. | |
| 8,610,507 B2 | * | 12/2013 | Ng ............................ | H03F 1/56 330/307 |

OTHER PUBLICATIONS

J. Moon et al., Effect of Input Second Harmonic Control for Saturated Amplifier, Microwave Symposium Digest (MTT), pp. 1-3, Jun. 2012.
J. Son et al., Broadband Saturated Power Amplifier With Harmonic Control Circuits, IEEE Microwave and Wireless Components Letters, vol. 24, Issue 3, pp. 185-187, Mar. 2014.

* cited by examiner

*Primary Examiner* — Henry Choe
(74) *Attorney, Agent, or Firm* — Sherry W. Schumm

(57) ABSTRACT

A packaged RF amplifier device includes a transistor, a first input circuit, and a second input circuit. The first input circuit includes a first series inductance coupled between an input lead and a first node, a second series inductance coupled between the first node and the transistor's control terminal, and a first shunt capacitance coupled between the first node and a ground reference. The second input circuit includes a first shunt inductance and a second shunt capacitance coupled in series between the input lead and the ground reference. The first input circuit and the second input circuit create a fundamental frequency match for the device. The second series inductance and the first shunt capacitance present a short circuit to the ground reference for RF energy at a second harmonic frequency.

20 Claims, 7 Drawing Sheets

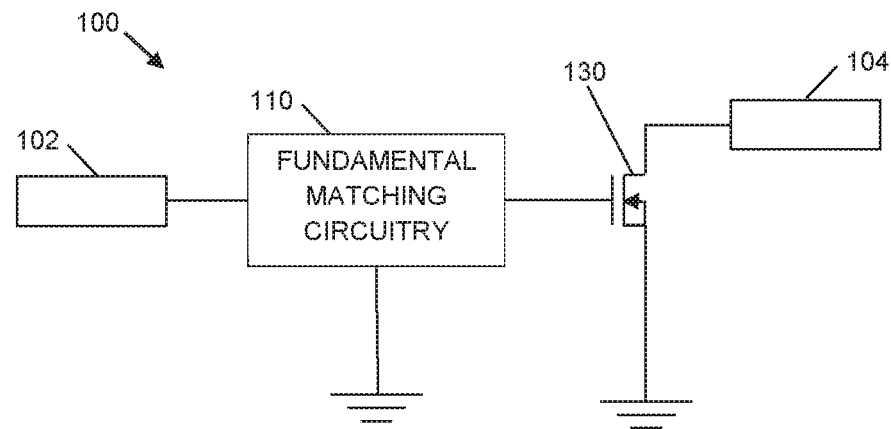
FIG. 1    -PRIOR ART-
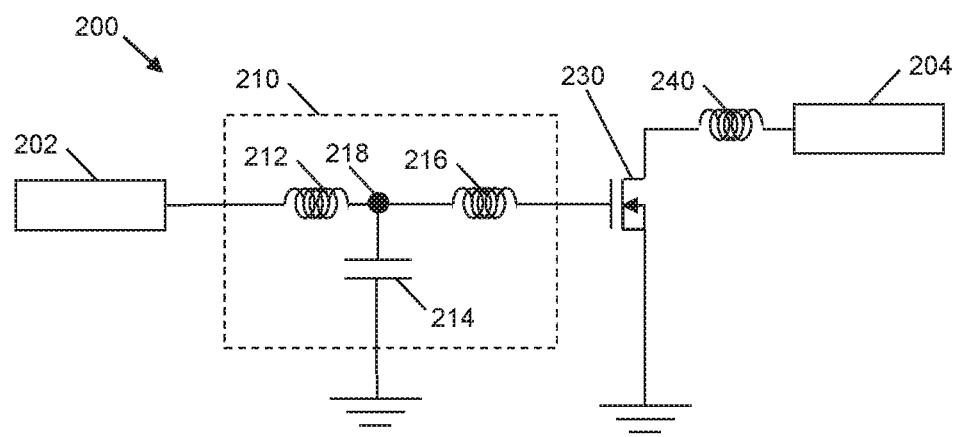
FIG. 2    -PRIOR ART-

US 9,979,361 B1

INPUT CIRCUITS FOR RF AMPLIFIER DEVICES, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include input impedance matching circuits.

BACKGROUND

A typical, high power radio frequency (RF) amplifier device includes a packaged power transistor that is configured to operate at a fundamental operating frequency, f0. For example, FIG. 1 is a simplified conceptual diagram of a typical, high power RF amplifier device 100, and FIG. 2 is a schematic diagram 200 of such an RF amplifier device. As shown, a typical RF amplifier device 100, 200 includes one or more input leads 102, 202, one or more output leads 104, 204, one or more transistors 130, 230, and input-side, fundamental matching circuitry 110, 210. In addition, a device 100, 200 may include bondwire arrays (e.g., in the form of inductances 212, 216) coupling each input lead 102, 202 to the control terminal (e.g., the gate) of each transistor 130, 230, and a bondwire array (e.g., in the form of inductance 240) coupling the output terminal (e.g., the drain) of each transistor 130, 230 to an output lead 104, 204.

The fundamental matching circuitry 110, 210 is configured to provide impedance matching between the input lead 102, 202 and the transistor 130, 230 at the fundamental frequency of operation, $f_0$, of the amplifier device 100, 200. For example, as shown in FIG. 2, the configuration of a typical fundamental matching circuitry 110, 210 may include a T-match circuit that includes two series inductances 212, 216 coupled between the input lead 202 and the control terminal of the transistor 230, and a shunt capacitance 214 between an intermediate node 218 and a ground reference.

For some types of amplifiers, it is desirable to mitigate the impacts of signal energy at harmonic frequencies. Accordingly, some amplifier circuits include harmonic control circuitry, which may reduce or minimize the conduction angle of the output current waveform (i.e., reduce or minimize the overlap between the output current and voltage waveforms). Due to package size limitations and a low gate node impedance at the second harmonic frequency in a high-power device, conventional methods of performing second harmonic frequency control may lead to non-optimal results. Accordingly, circuit and device designers continue to seek different methods and apparatus for providing harmonic frequency control in high-power amplifier circuits and devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a simplified conceptual diagram of an RF amplifier device;

FIG. 2 is a schematic diagram of an RF amplifier device;

DETAILED DESCRIPTION

Embodiments of packaged radio frequency (RF) amplifier devices are described herein, which include both fundamental matching circuitry and harmonic reduction circuitry at the input to an RF amplifier device. According to various embodiments, the fundamental matching circuitry and the harmonic reduction circuitry share some common components (e.g., inductances and capacitances), and the circuitry is configured to fit in a significantly smaller footprint than traditional circuitry. Thus, both the fundamental matching circuitry and the harmonic reduction circuitry may be implemented within a high-power amplifier device package. According to an embodiment, the capacitances associated with both the fundamental matching circuitry and the harmonic reduction circuitry may be integrated into a single integrated passive device, thus achieving a particularly compact implementation. Further, the fundamental matching capacitance may be implemented as a plurality of parallel capacitances, in an embodiment, each of which may be coupled to a different cell of the device's power transistor. The parallel capacitances each may have a same capacitance value, or different capacitance values to enable optimal matching for each transistor cell.

Figure 3:
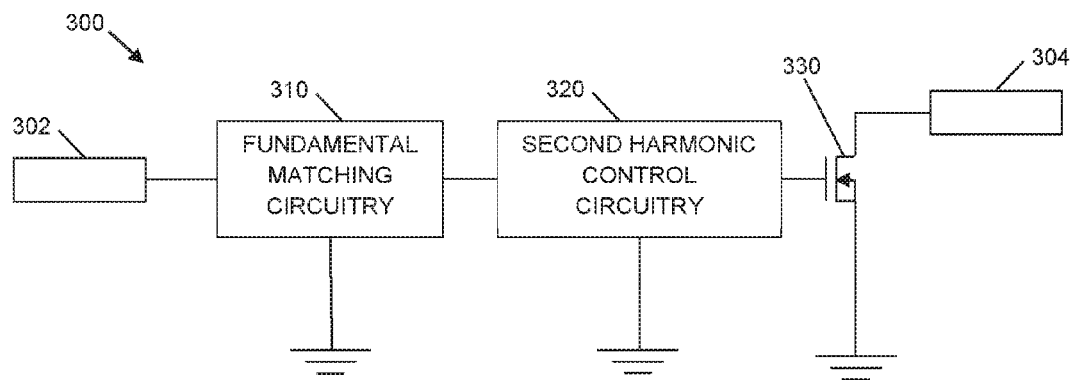
FIG. 3 is a simplified conceptual diagram of an RF amplifier device, in accordance with an example embodiment.
Figure 4:
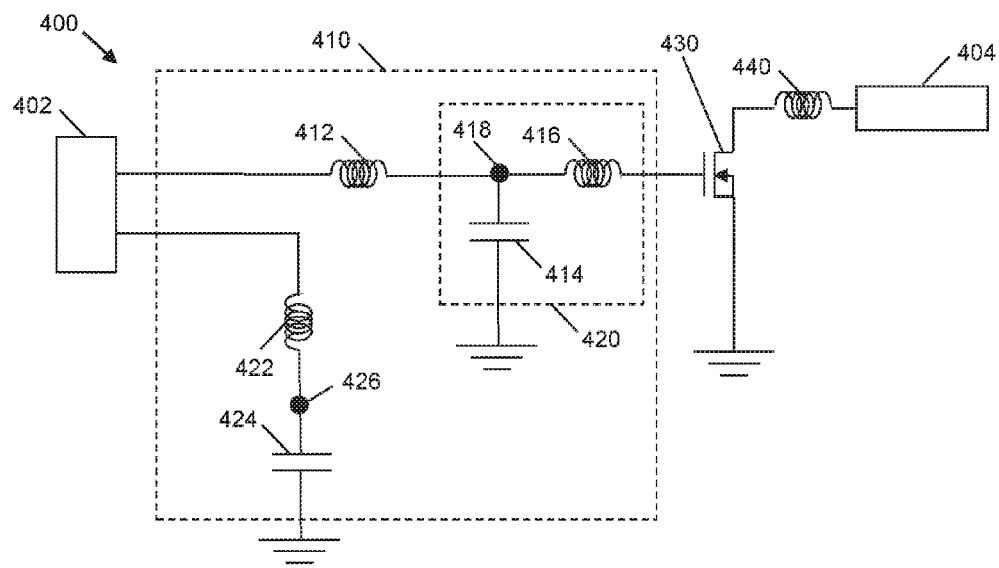
FIG. 4 is a schematic diagram of an RF amplifier device, in accordance with an example embodiment.

FIG. 3 is a schematic diagram of an RF amplifier device 300, in accordance with an embodiment, and FIG. 4 is a schematic diagram 400 of an embodiment of RF amplifier device 300. Essentially, device 300, 400 forms portions of an amplifier, which is configured to increase the power of an RF signal input to the device 300, 400. RF amplifier device 300, 400 includes a packaged power transistor 330, 430 that is configured to operate at a fundamental operating frequency, $f_0$.

RF amplifier device 300, 400 includes one or more input leads 302, 402, one or more output leads 304, 404, and one or more transistors 330, 430. In addition, RF amplifier device 300, 400 includes input-side, fundamental matching circuitry 310, 410, and input-side second harmonic control circuitry 320, 420. Although not specifically shown in the figures or described in detail herein, RF amplifier device 300, 400 also may include output-side impedance matching circuitry, as well.

In FIGS. 3 and 4, transistor 330, 340 and various elements of the input-side and output-side circuitry 310, 320, 410, 420, 440 are shown as singular components. This depiction is for the purpose of ease of explanation only. Those of skill in the art would understand, based on the description herein, that transistor 330, 430 and/or certain elements of the input and output circuits 310, 320, 410, 420, 440 each may be implemented as multiple components (e.g., connected in parallel or in series with each other), and examples of such embodiments are illustrated in the other figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 330, 430 and various elements of the input-side and output-side circuitry 310, 320, 410, 420, 440, below, thus are not intended to limit the scope of the inventive subject matter only to the illustrated embodiments.

Input lead 302, 402 and output lead 304, 404 each include a conductor, which is configured to enable the device 300, 400 to be electrically coupled with external circuitry (not shown). More specifically, input and output leads 302, 304, 402, 404 are physically located between the exterior and the interior of the device's package. Input-side circuitry 310, 410, 320, 420 is electrically coupled between the input lead 302, 402 and a first terminal of transistor 330, 430, which is also located within the device's interior, and output-side circuitry 440 is electrically coupled between a second terminal of transistor 330, 430 and the output lead 304, 404.

According to an embodiment, transistor 330, 430 is the primary active component of device 300, 400. Transistor 330, 430 includes a control terminal and two current conducting terminals, where the current conducting terminals are spatially and electrically separated by a variable-conductivity channel. For example, transistor 330, 430 may be a field effect transistor (FET) (such as a high electron mobility transistor (HEMT) or a metal oxide semiconductor FET (MOSFET)), which includes a gate (control terminal), a drain (a first current conducting terminal), and a source (a second current conducting terminal). Alternatively, transistor 330, 430 may be a bipolar junction transistor (BJT). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, the gate of transistor 330, 430 is coupled to the input lead 302, 402 through input-side circuitry 310, 320, 410, 420, the drain of transistor 330, 430 is coupled to output lead 304, 404 through output-side circuitry (e.g., inductance 440, which may be a bondwire array 540, FIG. 5), and the source of transistor 330, 430 is coupled to a ground reference (i.e., ground or another voltage reference). Through the variation of control signals (e.g., input RF signals) provided to the gate of transistor 330, 430, the current between the current conducting terminals of transistor 330, 430 may be modulated.

The fundamental matching circuitry 310, 410 is configured to provide impedance matching between the input lead 302, 402 and the transistor 330, 430 at the fundamental frequency of operation, $f_0$, of the amplifier device 300, 400. More specifically, fundamental matching circuitry 310, 410 is configured to raise the impedance of device 300, 400 to a higher (e.g., intermediate or higher) impedance level (e.g., in a range from about 2 to about 30 Ohms or higher). Accordingly, fundamental matching circuitry 310, 410 may be considered to be an input impedance matching circuit. Increasing the device impedance is advantageous in that it allows the printed circuit board level (PCB level) matching interface from a driver stage to have an impedance that can be achieved in high-volume manufacturing with minimal loss and variation (e.g., a "user friendly" matching interface).

The second harmonic control circuitry 320, 420 is configured to reduce components of the second harmonic frequency, $2f_0$, which may be present in an input RF signal (i.e., an RF signal received at input terminal 302, 402). More specifically, the second harmonic control circuitry 320, 420 is configured to provide a short circuit or low impedance path from the control terminal (or gate) of transistor 330, 430 to the ground reference for energy in an input RF signal at the second harmonic of the fundamental operating frequency, $2f_0$. The second harmonic control circuitry 320, 420 may help to minimize the conduction angle of the output current waveform (e.g., to minimize the overlap between the output current and voltage waveforms), thus increasing device efficiency.

According to an embodiment, the fundamental matching circuitry 310, 410 includes a plurality of passive components, including first and second series inductances 412, 416, first shunt capacitance 414, shunt inductance 422, and second shunt capacitance 424. For example, each of the inductances 412, 416, 422 may include one or more bondwires (e.g., bondwire arrays 512, 516, 522, FIG. 5). The first and second series inductances 412, 416 are coupled in series between the input lead 302, 402 and the control terminal (e.g., the gate) of transistor 330, 430, with an intermediate node 418 between the two inductances 412, 416. The intermediate node 418 is electrically coupled to a first electrode of the first shunt capacitance 414, and a second electrode of the first shunt capacitance 414 is electrically coupled to the ground reference. Inductance 422 and the second shunt capacitance 424 are electrically coupled in series between the input lead 402 and the ground reference, with intermediate node 426 between inductance 422 and capacitance 424. More specifically, a first electrode of the second shunt capacitance 424 is electrically coupled to the input lead 302, 402 through inductance 422, and a second electrode of the second shunt capacitance 424 is electrically coupled to the ground reference.

Characterized another way, the fundamental matching circuitry 310, 410 includes a first input circuit electrically coupled between the input lead 302, 402 and the control terminal of the transistor 330, 430, and a second input circuit electrically coupled between the input lead 302, 402 and the ground reference. The first input circuit includes the first and second series inductances 412, 416 and the first shunt capacitance 414, and the second input circuit includes the shunt inductance 422 and the second shunt capacitance 424.

According to an embodiment, the second harmonic control circuitry 320, 420 consists of the second series inductance 416 and the first shunt capacitance 414. More specifically, the inductance value of the second series inductance 416 and the capacitance value of the first shunt capacitance 414 are selected so that the second series inductance 416 and the first shunt capacitance 414 present a short circuit to the ground reference for RF energy at a second harmonic of the fundamental frequency of operation. As indicated in FIG. 4 and described above, the fundamental matching circuitry 310, 410 and the second harmonic control circuitry 320, 420 each include series inductance 416 and the first shunt capacitance 414. As will be shown and described in more detail in conjunction with FIG. 5, the sharing of components between the fundamental matching circuitry 310, 410 and the second harmonic control circuitry 320, 420 enables the fundamental matching circuitry 310, 410 and the second harmonic control circuitry 320, 420 to be implemented in a particularly compact manner, thus potentially yielding a smaller packaged device.

Embodiments of devices 300, 400 may be configured for optimal operation for fundamental operating frequencies, $f_o$, in a range of about 500 megahertz (MHz) to about 6 gigahertz (GHz), although devices 300, 400 may be configured for optimal operation at lower or higher fundamental operating frequencies, as well. According to an embodiment, the series combination of series inductances 412, 416 may have a value in a range between about 50 picohenries (pH) and about 3 nanohenries (nH), first shunt capacitance 414 may have a value in a range between about 200 femtofarads (fF) and about 10 picofarads (pF), shunt inductance 422 may have a value in a range between about 50 pH and about 1 nH, and second shunt capacitance 424 may have a value in a range between about 1 pF and about 50 pF.

Although not illustrated or described herein, an output matching circuit may be included between the output terminal (e.g., the drain) of transistor 330, 430 and the output lead 304, 404, in other embodiments. For example, such an output circuit may be configured to match the output impedance of device 300, 400 with the input impedance of an external circuit or component (not shown) that may be coupled to output lead 304, 404. More specifically, such an output circuit may provide a portion of an impedance match between the transistor 330, 430 and a load (not illustrated) to which the device 300, 400 is coupled. Accordingly, such an output circuit may be considered to be an output impedance matching circuit (or an output impedance "pre-match" circuit, where a remainder of the impedance matching is performed at the PCB level).

The embodiments illustrated and described herein correspond to a single-stage amplifier, in which a single transistor (e.g., transistor 330, 340) is used to amplify an input RF signal. Embodiments of the inventive subject matter also may be applied in multiple-stage (e.g., two-stage) amplifiers, in which a first transistor in a pre-amplifier stage amplifies the input RF signal, and a second amplifier in a main amplifier stage receives and further amplifies the RF signal output from the pre-amplifier stage. For example, the multiple amplifier stages may be implemented on a single transistor die, or the amplifier stages may be implemented on separate die. Although multiple-stage amplifiers are not discussed in detail herein, embodiments of multiple-stage amplifiers are included within the scope of the inventive subject matter.

Figure 5:
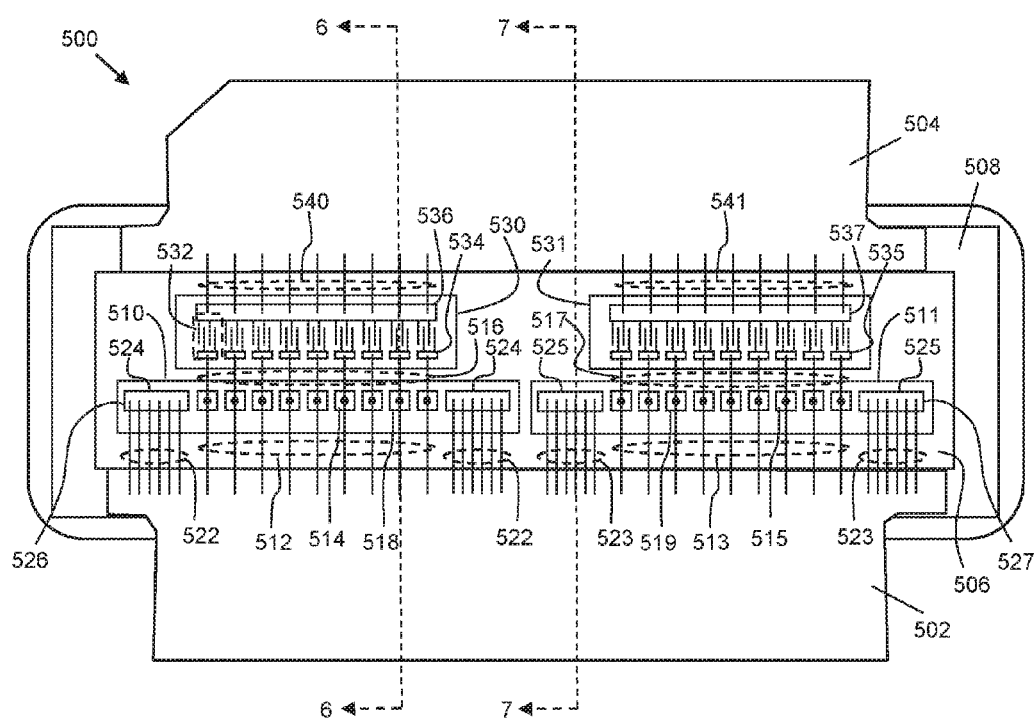
FIG. 5 is a top view of an example of a packaged RF amplifier device that embodies the circuit of FIG. 4, in accordance with an example embodiment.
Figure 6:
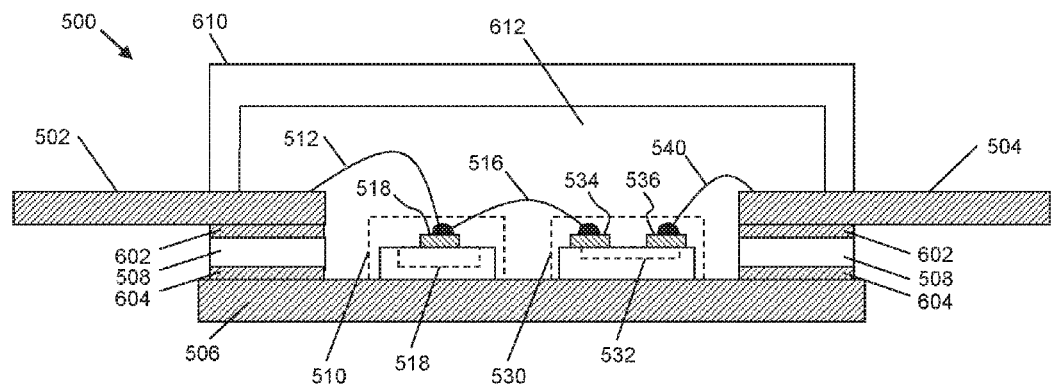
FIG. 6 is a cross-sectional, side view of the RF amplifier device of FIG. 5 along line 6-6.
Figure 7:
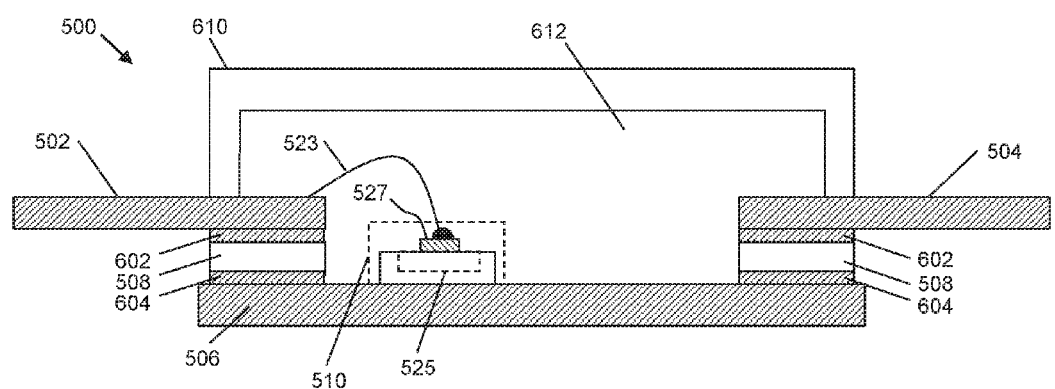
FIG. 7 is a cross-sectional, side view of the RF amplifier device of FIG. 5 along line 7-7.

FIG. 5 is a top view of an example of a packaged RF amplifier device 500 that embodies the circuit of FIG. 4, in accordance with an example embodiment. More particularly, the interconnected electrical components and elements of device 500 may be modeled by the schematic diagram of FIG. 4. One significant difference between the circuit of FIG. 4 and the implementation shown in the device 500 of FIG. 5, however, is that the device 500 of FIG. 5 includes two parallel amplification paths between input and output leads 502, 504 (e.g., two parallel instances of the circuitry of FIG. 4 between leads 402, 404). For enhanced understanding, FIG. 5 should be viewed in parallel with FIGS. 6 and 7, where FIG. 6 is a cross-sectional, side view of the RF amplifier device of FIG. 5 along line 6-6, and FIG. 7 is a cross-sectional, side view of the RF amplifier device of FIG. 5 along line 7-7. More specifically, FIGS. 6 and 7 are cross-sectional views through input and output leads 502, 504 and the active device area.

Device 500 includes an input lead 502 (e.g., input lead 402, FIG. 4), an output lead 504 (e.g., output lead 404, FIG. 4), a flange 506, an isolation structure 508, a plurality of transistors 530, 531 (e.g., two instances of transistor 430, FIG. 4), and a plurality of input-side circuits (e.g., two instances of fundamental matching circuitry 410 and second harmonic control circuitry 420, FIG. 4), all of which may be packaged together as parts of the device 500. In the example of FIG. 5, device 500 includes two transistors 530, 531 that essentially function in parallel, although another semiconductor device may include one transistor or more than two transistors, as well. In addition, device 500 includes two input-side integrated passive devices (IPDs) 510, 511, which also essentially function in parallel. It is to be understood that more or fewer IPDs 510, 511 may be implemented, as well. For purposes of clarity, transistors 530, 531 and IPDs 510, 511 each may be referred to in the singular sense, below, as will analogous components in other, later-described figures. It is to be understood that the description of a particular device component in the singular sense applies to the set of all such components. According to an embodiment, jumper wires (not illustrated) may be electrically coupled between the multiple transistors 530, 531 and IPDs 510, 511, in order to provide low frequency paths between corresponding components.

According to an embodiment, and referring to FIGS. 6 and 7, device 500 is incorporated in an air cavity package, in which transistors 530, 531 and various input and output circuit elements 510-517, 522, 523, 540, 541 are located within an enclosed air cavity 612. Basically, the air cavity is bounded by flange 506, isolation structure 508, and a cap 610 overlying and in contact with the isolation structure 508 and leads 502, 504. In other embodiments, a device may be incorporated into an overmolded package (i.e., a package in which the electrical components within the active device area are encapsulated with a non-conductive molding compound, and in which portions of the leads 502, 504, and all or portions of the isolation structure 508 also may be encompassed by the molding compound).

Flange 506 includes a rigid electrically-conductive substrate, which has a thickness that is sufficient to provide structural support for electrical components and elements of device 500. In addition, flange 506 may function as a heat sink for transistors 530, 531 and other devices mounted on flange 506. Flange 506 has a top and bottom surface (only a central portion of the top surface is visible in FIG. 5), and a substantially-rectangular perimeter that corresponds to the perimeter of the device 500 (e.g., to the perimeter of isolation structure 508, described below).

Flange 506 is formed from a conductive material, and may be used to provide a ground reference for the device 500. For example, various components and elements may have terminals that are electrically coupled to flange 506, and flange 506 may be electrically coupled to a system ground when the device 500 is incorporated into a larger electrical system. At least the surface of flange 506 is formed from a layer of conductive material, and possibly all of flange 506 is formed from bulk conductive material. Alternatively, flange 506 may have one or more layers of non-conductive material below its top surface. Either way, flange 506 has a conductive top surface. Flange 506 may more generally be referred to as a substrate with a conductive surface.

Isolation structure 508 is attached to the top surface of flange 506. Isolation structure 508 is formed from a rigid, electrically insulating material (i.e., a material with a dielectric constant in a range from about 3.0 to about 30.0, although materials with higher or lower dielectric constants may be used), and has a top surface and an opposed bottom surface. The term "isolation structure," as used herein, refers to a structure that provides electrical isolation between conductive features of a device (e.g., between leads 502, 504 and flange 506). For example, isolation structure 508 may be formed from inorganic materials (e.g., ceramic such as aluminum oxide, aluminum nitride, and so on) and/or organic materials (e.g., one or more polymers or printed circuit board (PCB) materials).

In an embodiment, conductive layers 602, 604 (e.g., copper layers) may be included on the top and bottom surfaces of the isolation structure 508. The conductive layer 602 on the top surface of the isolation structure 508 may be soldered, brazed, or otherwise attached to leads 502, 504, and the conductive layer 604 on the bottom surface of the isolation structure 508 may be soldered, brazed, or otherwise coupled to the flange 506. In other embodiments, conductive layers 602, 604 may be excluded from the top and/or bottom surface of the isolation structure 508. In such embodiments, leads (e.g., leads 502, 504) may be coupled to the isolation structure 508 using epoxy (or other adhesive materials), and/or the isolation structure 508 may be coupled to the flange 506 using epoxy (or other adhesive materials).

Isolation structure 508 has a frame shape, in an embodiment, which includes a substantially enclosed, four-sided structure with a central opening. Isolation structure 508 may have a substantially rectangular shape, as shown in FIG. 5, or isolation structure 508 may have another shape (e.g., annular ring, oval, and so on). Isolation structure 508 may be formed as a single, integral structure, or isolation structure 508 may be formed as a combination of multiple members. For example, in an alternate embodiment, isolation structure 508 may include multiple portions that contact each other or that are spatially separated from each other (e.g., isolation structure 508 may have one portion isolating input lead 502 from flange 506, and another portion isolating output lead 504 from flange 506).

The input and output leads 502, 504 are mounted on a top surface of the isolation structure 508 on opposed sides of the central opening, and thus the input and output leads 502, 504 are elevated above the top surface of the flange 506, and are electrically isolated from the flange 506. For example, the input and output leads 502, 504 may be soldered or otherwise attached to metallization 602 on a top surface of isolation structure 508. Generally, the input and output leads 502, 504 are oriented in order to allow for attachment of bondwires (e.g., bondwires 512, 513, 522, 523) between the input and output leads 502, 504 and components and elements within the central opening of isolation structure 508.

Transistor die 530, 531 and various elements 510, 511 of the input circuitry are mounted on a generally central portion of the top surface of a flange 506 that is exposed through the opening in isolation structure 508. As used herein, an "active device area" corresponds to a portion of a device on which one or more active devices (e.g., transistor die 530, 531) are mounted (e.g., the portion of the conductive surface of flange 506 that is exposed through the opening in isolation structure 508). According to an embodiment, transistor die 530, 531 are positioned within the active device area of device 500, along with IPDs 510, 511. For example, the transistor die 530, 531 and IPDs 510, 511 may be coupled to flange 506 using conductive epoxy, solder, solder bumps, sintering, and/or eutectic bonds.

The transistor die 530, 531 may be implemented using various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Further, each of the transistors within the transistor die 530, 531 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, each of the transistors may be a bipolar junction transistor (BJT). References herein to a "gate," "drain," and "source," which are commonly used to describe FETs, are not intended to be limiting, as each of these designations has analogous features for a BJT implementation (e.g., a base, collector, and emitter, respectively).

Each transistor die 530, 531 includes one or more serially-connected transistors and/or parallel transistor cells (e.g., cell 532), each of which has a control terminal (e.g., a gate) and two current conducting terminals (e.g., a drain and a source). In the embodiment depicted in FIG. 5, for example, each transistor includes nine transistor cells arranged in parallel with each other. Alternatively, a transistor may have more or fewer cells. For a multi-cell transistor, each transistor cell 532 includes a control terminal (e.g., a gate terminal) that is electrically coupled to a distinct conductive landing pad 534, 535 exposed at the top surface of a transistor die 530, 531, and a current conducting terminal (e.g., a drain terminal) that is electrically coupled to a common conductive bar 536, 537 exposed at the top surface of a transistor die 530, 531. On the output side, each common conductive bar 536, 537 is electrically coupled to the output lead 504 through bondwires 540, 541 (e.g., inductive element 440, FIG. 4). The other current conducting terminal (e.g., the source) of each transistor cell 532 is electrically coupled to the flange 506 (e.g., to ground), in an embodiment. For example, the source of each transistor cell 532 may be electrically coupled to the flange 506 through the semiconductor substrate of each transistor die 530, 531.

On the input side, the control terminal of each transistor cell 532 is electrically coupled to the input lead 502 through a conductive landing pad 534, 535 and an instance of a first portion of the input-side circuitry (e.g., a first portion of fundamental matching circuitry 410 and the second harmonic control circuitry 420, FIG. 4). More specifically, the "first portion" of the input-side circuitry through which each transistor cell 532 is electrically coupled to the input lead 502 includes first and second series inductances (e.g., inductances 412, 416, FIG. 4) and a first shunt capacitance (e.g., capacitance 414, FIG. 4). For example, in the device 500 of FIG. 5, the transistor cells 532 are coupled to the input lead 502 through a portion of the input-side circuitry that includes series-coupled, first and second sets (or arrays) of bondwires 512, 513, 516, 517 (e.g., corresponding to multiple instances of series-coupled inductive elements 412, 416, FIG. 4), and multiple, parallel-coupled first shunt "sub-capacitors" 514, 515 (e.g., with each "sub-capacitor" corresponding to an instance of first shunt capacitor 414, FIG. 4). Considered another way, the plurality of transistor cells 532 of each transistor die 530, 531 is coupled to the input lead 502 through a first series inductive element in the form of bondwire array 512, 513, a second series inductive element in the form of bondwire array 516, 517, and a first shunt capacitance in the form of a plurality of parallel-coupled sub-capacitors 514, 515. FIG. 5 depicts a 1:1 ratio between the number of transistor cells 532, the number of bondwires in the first series bondwire array 512, 513, the number of bondwires in the second series bondwire array 516, 517, and the number of first shunt sub-capacitors 514, 515. Alternatively, ratios other than a 1:1 ratio may be implemented for the numbers of transistor cells 532, bondwires in arrays 512, 513, 516, 517, and shunt sub-capacitors 514, 515.

As will be described in more detail in conjunction with FIGS. 8-12, each of the first shunt sub-capacitors 514, 515 includes a first electrode that is electrically coupled to a conductive landing pad 518, 519 exposed at the top surface of an IPD 510, 511, and a second electrode that is electrically coupled to the flange 506 (e.g., to ground), in an embodiment. For example, the second electrode of each first shunt sub-capacitor 514, 515 may be electrically coupled to the flange 506 through the substrate of each IPD 510, 511. Each conductive landing pad 518, 519 may be sized to provide a connection point for one bondwire of bondwire array 512, 513 and one bondwire of bondwire array 516, 517, as shown in FIG. 5. Alternatively, each conductive landing pad 518, 519 may be sized to provide a connection point for multiple bondwires of each of bondwire arrays 512, 513, 516, 517. In any event, each conductive landing pad 518, 519 corresponds to an intermediate node (e.g., node 418, FIG. 4) between each set of series-coupled inductances (or bondwires of bondwire arrays 512, 513, 516, 517).

Also on the input side, the input lead 502 is electrically coupled to the ground reference (e.g., to the flange 506) through a second portion of the input-side circuitry (e.g., a second portion of fundamental matching circuitry 410, FIG. 4). More specifically, the "second portion" of the input-side circuitry through which the input lead 502 is electrically coupled to the ground reference includes a shunt inductance (e.g., inductance 422, FIG. 4) and a second shunt capacitance (e.g., capacitance 424, FIG. 4). For example, in the device 500 of FIG. 5, the input lead 502 is coupled to the ground reference through a portion of the input-side circuitry that includes a third set (or array) of bondwires 522, 523 (e.g., corresponding to multiple instances of shunt inductive element 422, FIG. 4), and multiple, parallel-coupled second shunt "sub-capacitors" 524, 525 (e.g., with each "sub-capacitor" corresponding to an instance of second shunt capacitor 424, FIG. 4). Considered another way, for each transistor die 530, 531, the input lead 502 is electrically coupled to the ground reference through a first shunt inductive element in the form of two shunt bondwire arrays 522, 523 and a second shunt capacitance in the form of two to two second shunt sub-capacitors 524, 525. Although each second shunt capacitor 524, 525 is shown to be implemented using two parallel sub-capacitors 524, 525, each second shunt capacitor may consist of more or fewer parallel shunt sub-capacitors.

As will be described in more detail in conjunction with FIGS. 8-12, each of the second shunt sub-capacitors 524, 525 includes a first electrode that is electrically coupled to a conductive landing pad 526, 527 exposed at the top surface of an IPD 510, 511, and a second electrode that is electrically coupled to the flange 506 (e.g., to ground), in an embodiment. For example, the second electrode of each second shunt sub-capacitor 524, 525 may be electrically coupled to the flange 506 through the substrate of each IPD 510, 511. Each conductive landing pad 526, 527 may be sized to provide a connection point for an array of multiple bondwires 522, 523, as shown in FIG. 5. Further, each conductive landing pad 526, 527 corresponds to an intermediate node (e.g., node 426, FIG. 4) between a shunt inductance (or bondwires of bondwire arrays 522, 523) and a second shunt capacitance.

As discussed above, and as illustrated in FIG. 5, the first and second shunt capacitors 514, 515, 524, 525 associated with any given transistor die 530, 531 may be implemented in a single IPD 510, 511, in an embodiment. As used herein, the terms "integrated passive device" and "IPD" refer to a structure that includes a substrate and at least one passive device (e.g., at least one capacitor) coupled to the substrate. In various embodiments, the substrate may be a semiconductor substrate, a substrate formed from PCB materials, a ceramic substrate, or another suitable substrate. Further, the passive device(s) "coupled to" an IPD may be monolithically formed with the substrate, or the passive device(s) may be discrete devices (e.g., chip capacitors) that are connected to (e.g., soldered to) conductive pads that are monolithically formed with the substrate. Specific example embodiments of IPDs are illustrated in FIGS. 8-12 and are described as including a semiconductor substrate and capacitors that are monolithically formed with the substrate. The example embodiments should not be construed as limiting the scope of the inventive subject matter only to such embodiments, as IPDs with non-semiconductor substrates and/or discrete capacitors also are considered to fall within the scope of the inventive subject matter.

Figure 8:
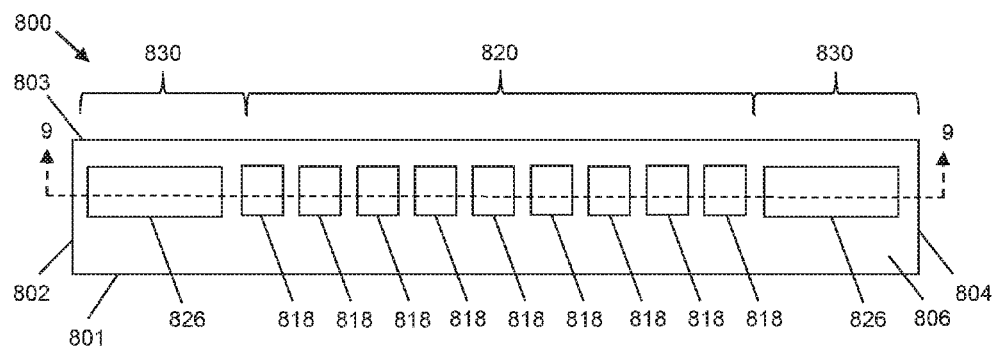
FIG. 8 is a top view of an example of an integrated passive device that may be used in an RF amplifier device to provide capacitances for fundamental matching and harmonic control, in accordance with an example embodiment.

For example, FIG. 8 is a top view of an example of an IPD 800 (e.g., IPD 510, FIG. 5) that may be used in an RF amplifier device (e.g., device 500, FIG. 5) to provide capacitances for fundamental matching and harmonic control, in accordance with an example embodiment. For enhanced understanding, FIG. 8 should be viewed in parallel with FIG. 9, which is a cross-sectional, side view of IPD 800 of FIG. 8 along line 9-9.

IPD 800 has a top surface 806, a bottom surface 906, and sides 801, 802, 803, 804 extending between the top and bottom surfaces 806, 906. According to an embodiment, IPD 800 includes a semiconductor substrate 910, which may be formed from any of a variety of semiconductor materials, including but not limited to silicon, gallium arsenide, gallium nitride, and so on. A plurality of conductive layers 920, 921 and dielectric layers 923, 924 are built up on a top surface 912 of the substrate 910. In addition, IPD 800 may include a conductive layer 922 formed on a bottom surface 914 of substrate 910.

According to an embodiment, one or more first shunt capacitors 914 (e.g., first shunt capacitors 514, FIG. 5) are positioned within a central portion 820 of the IPD 800, and one or more second shunt capacitors 924 (e.g., second shunt capacitors 524, FIG. 5) are positioned within edge portions 830 of the IPD 800. Further, all of the shunt capacitors 914, 924 are aligned in a single row extending between sides 802, 804. When incorporated into a packaged RF amplifier device (e.g., device 500, FIG. 5), IPD 800 is oriented so that the row along which the shunt capacitors 914, 924 are aligned is substantially perpendicular to the direction of an RF signal through the device (e.g., perpendicular to a line between input and output leads 502, 504, FIG. 5).

Figure 9:
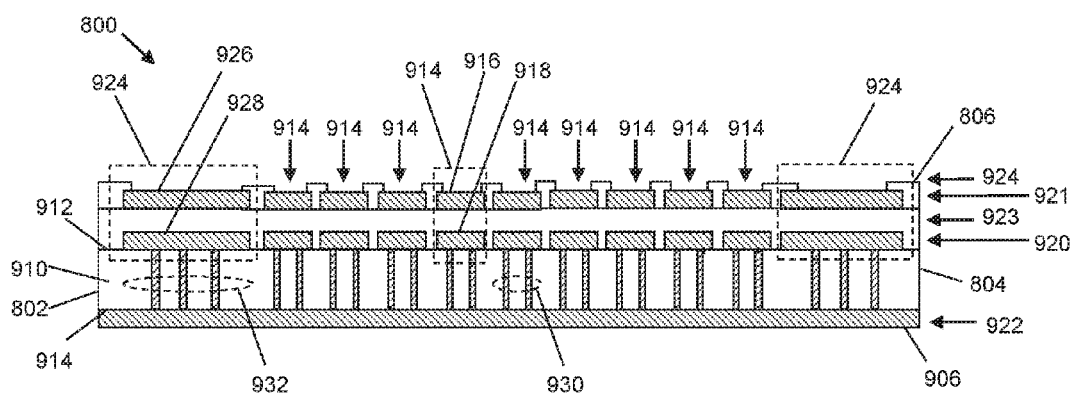
FIG. 9 is a cross-sectional, side view of the integrated passive device of FIG. 8 along line 9-9.

According to an embodiment, each of the first and second shunt capacitors 914, 924 is implemented as a Metal Oxide Semiconductor capacitor (or MOScap), with simplified representations of such capacitors being depicted in FIG. 9. Alternatively, the first and second shunt capacitors 914, 924 may be implemented as metal-insulator-metal (MIM) capacitors or as some other type of capacitor. Either way, each first shunt capacitor 914 may include a first or top electrode (or plate) 916 and a second or bottom electrode (or plate) 918, which are electrically separated by dielectric material. For example, the first electrodes 916 may be formed from portions of conductive layer 921, the second electrodes 918 may be formed from portions of conductive layer 920, and the intermediate dielectric material may be formed from portions of dielectric layer 923 (e.g., a thin nitride or oxide layer). Similarly, each second shunt capacitor 924 may include a first electrode (or plate) 926 and a second electrode (or plate) 928 (e.g., formed from portions of conductive layers 921, 920), which are electrically separated by dielectric material (e.g., portions of dielectric layer 923).

In some embodiments, the top electrodes 916, 926 may be formed from portions of a highest conductive layer 921, and portions of the conductive layer 921 that are exposed at the top surface 806 of the IPD 800 may serve as bonding pads 818, 826 for bondwires (e.g., for bondwires 512, 516, 522, FIG. 5). According to an embodiment, bonding pads 818 may be sized to accept connection of a single bondwire, and bonding pads 826 may be sized to accept connection of multiple bondwires. Alternatively, bonding pads 818 may be larger and/or bonding pads 826 may be smaller. Further, in other embodiments, the top electrodes 916, 926 may be formed from portions of a conductive layer that is lower than the highest conductive layer 921, and the top electrodes 916, 928 may be electrically connected to the bonding pads 818, 826 through various conductive structures (e.g., conductive vias and/or traces). In any event, each bonding pad 818 functions as an intermediate node (e.g., node 418, FIG. 4) between first and second series inductive elements (e.g., inductive elements 412, 416, FIG. 4 or bondwires 512, 516, FIG. 5). Similarly, each bonding pad 826 functions as an intermediate node (e.g., node 426, FIG. 4) between a shunt inductive element (e.g., inductive element 422, FIG. 4 or bondwires 522, FIG. 5) and a shunt capacitance (e.g., capacitor 424, FIG. 4 or capacitor 524, FIG. 5).

The bottom electrodes 918, 928 are electrically coupled to the bottom surface 914 of the substrate 910 or to the conductive layer 922 overlying the bottom surface 914 of the substrate 910. According to an embodiment, the bottom electrodes 918, 928 are electrically coupled to the bottom surface 914 of the substrate 910 using conductive through substrate vias (TSVs) 930, 932. According to an embodiment, this configuration enables the bottom electrodes 918, 928 to be grounded when the bottom surface 914 of the substrate 910 or the conductive layer 922 is connected to a ground reference (e.g., to a conductive surface of flange 506, FIG. 5).

According to an embodiment, each of the first shunt capacitors 914 has substantially the same capacitance value. In alternate embodiments, the first shunt capacitors 914 may have different values from each other. The differences in capacitance values may be achieved, for example, by varying the sizes of the top and/or bottom electrodes 916, 918, and/or by varying the amount of overlap between the top and bottom electrodes 916, 918. For example, the capacitance values for the first shunt capacitors 914 may vary from a lowest capacitance value to a highest capacitance value that is about 5 percent to about 30 percent greater than the lowest capacitance value. As the impedances of the transistor cells (e.g., cell 532, FIG. 5) in any particular transistor die may differ, this enables each of the first shunt capacitors 914 to be configured to provide optimal impedance matching for the transistor cell to which it is electrically coupled. In addition or alternatively, the lengths, heights, and/or shapes of the bondwires (e.g., bondwires 516, FIG. 5) between the transistor cells and the IPD (e.g., IPD 510) may be varied to achieve differences in the impedance matching for the transistor cells.

As mentioned above, the representations of capacitors 914, 924 in FIG. 9 are simplified. More specifically, each capacitor 914, 924 is shown to have a top electrode 916, 926 that corresponds to a portion of a highest conductive layer 921 (i.e., M2 or a conductive layer farthest from the substrate 910 and closest to the top surface 806 of the IPD 800), and a bottom electrode 918, 928 that corresponds to a portion of a lowest conductive layer 920 (i.e., M1 or a conductive layer closest to the substrate 910). In other embodiments, an IPD may have more than two conductive layers, and the capacitor electrodes may be formed from portions of layers other than the lowest and/or highest layers. Further, although capacitors 914, 924 are depicted as simple parallel-plate capacitors, each of the electrodes alternatively may be multi-layer electrodes, and the multiple layers of one electrode may be interleaved with the multiple layers of the other electrode. Further, the electrical connections between the bottom electrodes 918, 928 and the bottom surface 914 of the substrate 910 may be made with TSVs that do not directly underlie the bottom electrodes 918, 928, and/or the electrical connections may include additional or different conductive structures.

The embodiment of FIGS. 8 and 9 includes nine first shunt capacitors 914 and two second shunt capacitors 924. Alternate embodiments may include more or fewer of either capacitor 914, 924, including as few as one first shunt capacitor 914 and one second shunt capacitor 924. Further, in the embodiment of FIGS. 8 and 9, the first shunt capacitors 914 are physically positioned together in the central portion 820 of the IPD 800, and the second shunt capacitors 924 are physically positioned in edge portions 830 of the IPD 800. In various alternate embodiments, the first and second shunt capacitors may be differently positioned.

Figure 10:
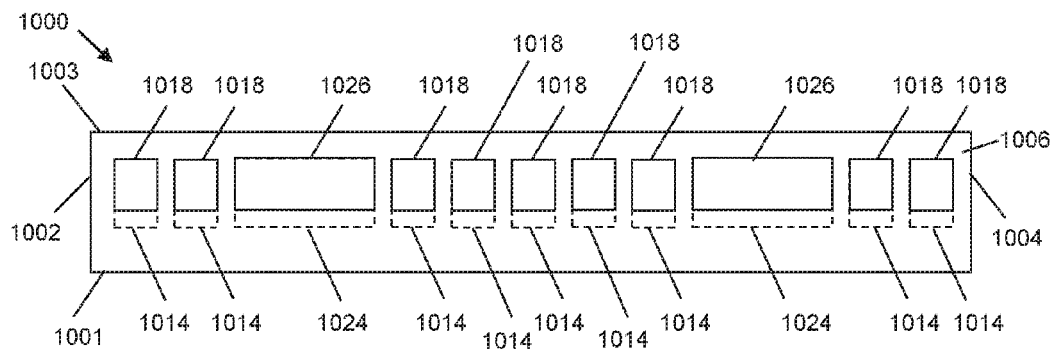
FIG. 10 is a top view of an example of an integrated passive device that may be used in an RF amplifier device to provide capacitances for fundamental matching and harmonic control, in accordance with another example embodiment.

For example, the first and second shunt capacitors may be interleaved with each other as shown in FIG. 10, which is a top view of an example of an IPD 1000 that may be used in an RF amplifier device (e.g., device 500, FIG. 5) to provide capacitances for fundamental matching and harmonic control, in accordance with another example embodiment. IPD 1000 has many similarities to the previously-described IPD 800 (FIGS. 8 and 9), and to the extent that various features of IPD 1000 are analogous to features of IPD 800, the details of similar features are not repeated below for brevity. Instead, all of the details of IPD 800 apply also to IPD 1000, except as indicated below.

As with IPD 800, IPD 1000 has a top surface 1006, a bottom surface (not shown in FIG. 10), and sides 1001, 1002, 1003, 1004 extending between the top and bottom surfaces. According to an embodiment, IPD 1000 also includes one or more first shunt capacitors 1014 (e.g., first shunt capacitors 514, FIG. 5 or 414, FIG. 4) and one or more second shunt capacitors 1024 (e.g., second shunt capacitors 524, FIG. 5 or 424, FIG. 4), each indicated with dashed lines as they are below the top surface 1006 of IPD 1000. Top terminals of each of the first shunt capacitors 1014 are electrically coupled to corresponding bond pads 1018 exposed at the top surface 1006, and bond pads 1018 are configured for attachment with series inductive elements (e.g., bondwires 512, 516, FIG. 5 or inductive elements 412, 416, FIG. 4). Similarly, top terminals of each of the second shunt capacitors 1024 are electrically coupled to corresponding bond pads 1026 exposed at the top surface 1006, and bond pads 1026 are configured for attachment with a shunt inductive element (e.g., bondwires 522, FIG. 5 or inductive element 422, FIG. 4).

Unlike IPD 800, the first and second shunt capacitors 1014, 1024 are interleaved with each other in a row that extends between sides 1002, 1004. More particularly, along with several of the first shunt capacitors 1018, the second shunt capacitors 1024 are located within the central portion of the IPD 1000, rather than being located within edge portions of the IPD 1000 (e.g., edge portions 830, FIG. 8). As would be understood by one of skill in the art, based on the description herein, the various bondwire arrays (e.g., bondwire arrays 512, 516, 522, FIG. 5) would be repositioned within an RF amplifier device to appropriately connect with the bond pads 1018, 1026.

Figure 11:
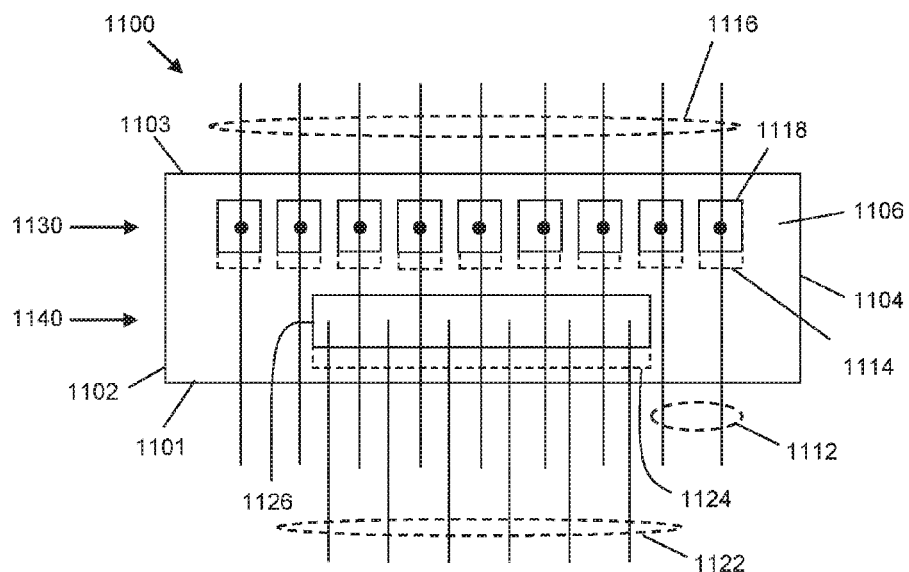
FIG. 11 is a top view of an example of an integrated passive device that may be used in an RF amplifier device to provide capacitances for fundamental matching and harmonic control, in accordance with yet another example embodiment.

In the embodiments of FIGS. 8-10, the first and second shunt capacitors 914, 924, 1014, 1024 and their associated bond pads 818, 826, 1018, 1026 all are aligned in a single row across the IPD 800, 1000. In various alternate embodiments, the first and second shunt capacitors may be positioned in multiple rows within an IPD. For example, FIG. 11 is a top view of an example of an IPD 1100 that may be used in an RF amplifier device (e.g., device 500, FIG. 5) to provide capacitances for fundamental matching and harmonic control, in accordance with yet another example embodiment. IPD 1100 has many similarities to the previously-described IPD 800 (FIGS. 8 and 9), and to the extent that various features of IPD 1100 are analogous to features of IPD 800, the details of similar features are not repeated below for brevity. Instead, all of the details of IPD 800 apply also to IPD 1100, except as indicated below.

As with IPD 800, IPD 1100 has a top surface 1106, a bottom surface (not shown in FIG. 11), and sides 1101, 1102, 1103, 1104 extending between the top and bottom surfaces. According to an embodiment, IPD 1100 also includes one or more first shunt capacitors 1114 (e.g., first shunt capacitors 514, FIG. 5 or 414, FIG. 4) and one or more second shunt capacitors 1124 (e.g., second shunt capacitors 524, FIG. 5 or 424, FIG. 4), each indicated with dashed lines as they are below the top surface 1106 of IPD 1100. In the embodiment of FIG. 11, IPD 1100 specifically includes nine first shunt capacitors 1114 aligned in a first row 1130, and a single second shunt capacitor 1124 in a second row 1140 that is offset from the first row 1130. More specifically, when incorporated in an RF amplifier device (e.g., device 500, FIG. 5), the first row 1130 may be located proximate to a first side 1103 of the IPD 1100 that is closer to the transistor die (e.g., die 530, FIG. 5), and the second row 1140 may be proximate to a second side 1101 of the IPD 100 that is closer to the input lead (e.g., input lead 502, FIG. 5). Alternatively, the IPD 1100 could be rotated 180 degrees so that the first shunt capacitor(s) 1114 could be positioned closer to the input lead, and the second shunt capacitor(s) 1124 could be positioned closer to the transistor die.

Top terminals of each of the first shunt capacitors 1114 are electrically coupled to corresponding bond pads 1118 exposed at the top surface 1106, and bond pads 1118 are configured for attachment with series inductive elements 1112, 1116 (e.g., analogous to bondwires 512, 516, FIG. 5 or inductive elements 412, 416, FIG. 4). Similarly, top terminal (s) of each of the second shunt capacitor(s) 1124 are electrically coupled to corresponding bond pad(s) 1126 exposed at the top surface 1106, and bond pad(s) 1126 are configured for attachment with a shunt inductive element 1122 (e.g., analogous to bondwires 522, FIG. 5 or inductive element 422, FIG. 4).

Figure 12:
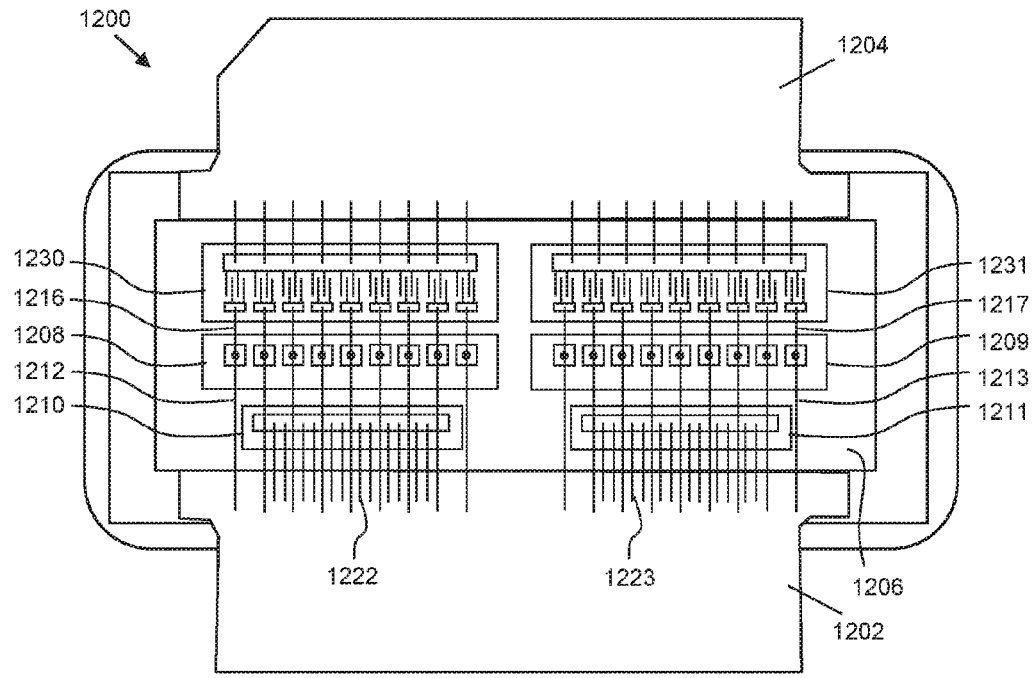
FIG. 12 is a top view of an example of a packaged RF amplifier device that embodies the circuit of FIG. 4, in accordance with another example embodiment.

In still other alternate embodiments, the first shunt capacitor(s) (e.g., first shunt capacitors 514, FIG. 5 or 414, FIG. 4) and the second shunt capacitor(s) (e.g., second shunt capacitors 524, FIG. 5 or 424, FIG. 4) could be implemented on separate IPDs. For example, FIG. 12 is a top view of an example of a packaged RF amplifier device 1200 that embodies the circuit of FIG. 4, in accordance with another example embodiment. Device 1200 has many similarities to the previously-described RF amplifier device 500 (FIG. 5), and to the extent that various features of device 1200 are analogous to features of device 500, the details of similar features are not repeated below for brevity. Instead, all of the details of device 500 apply also to device 1200, except as indicated below.

As with device 500 (FIG. 5), device 1200 includes an input lead 1202 (e.g., input lead 402, FIG. 4), an output lead 1204 (e.g., output lead 404, FIG. 4), a flange 1206, a plurality of transistors 1230, 1231 (e.g., two instances of transistor 430, FIG. 4), and a plurality of input-side circuits (e.g., two instances of fundamental matching circuitry 410 and second harmonic control circuitry 420, FIG. 4), all of which may be packaged together as parts of the device 1200. Unlike the device 500 of FIG. 5, however, device 1200 includes two input-side IPDs 1208, 1209, 1210, 1211 in each amplification path, as opposed to a single input-side IPD 510, 511 in the embodiment of FIG. 5. Transistor die 1230, 1231 and the IPDs 1208-1211 are mounted on a generally central portion of the top surface of flange 1206.

On the input side, the control terminal of each transistor cell is electrically coupled to the input lead 1202 through first and second series inductances (e.g., inductances 412, 416, FIG. 4) and a first shunt capacitance (e.g., capacitance 414, FIG. 4). For example, in the device 1200 of FIG. 12, the transistor cells are coupled to the input lead 1202 through bondwires 1212, 1213, 1216, 1217 (e.g., corresponding to multiple instances of series-coupled inductive elements 412, 416, FIG. 4), and multiple, parallel-coupled first shunt sub-capacitors implemented in a first shunt capacitor IPD 1208, 1209 (e.g., with each "sub-capacitor" corresponding to an instance of first shunt capacitor 414, FIG. 4).

Also on the input side, the input lead 1202 is electrically coupled to the ground reference (e.g., to the flange 1206) through a shunt inductance (e.g., inductance 422, FIG. 4) and a second shunt capacitance (e.g., capacitance 424, FIG. 4). For example, in the device 1200 of FIG. 12, the input lead 1202 is coupled to the ground reference through bondwires 1222, 1223 (e.g., corresponding to multiple instances of shunt inductive element 422, FIG. 4), and second shunt capacitor(s) implemented in a second shunt capacitor IPD 1210, 1211 that is distinct from the first shunt capacitor IPD 1208, 1209 (e.g., with each second shunt capacitor corresponding to an instance of second shunt capacitor 424, FIG. 4).

In the embodiment of FIG. 12, the IPDs 1208, 1209 that include the first shunt capacitors are positioned closer to the transistor die 1230, 1231, and the IPDs 1210, 1211 that include the second shunt capacitors are positioned closer to the input lead 1202. In an alternate embodiment, the IPDs 1208-1211 could be reversed in position. More particularly, the IPDs 1208, 1209 that include the first shunt capacitors could be positioned closer to the input lead 1202, and the IPDs 1210, 1211 that include the second shunt capacitors could be positioned closer to the transistor die 1230, 1231.

Figure 13:
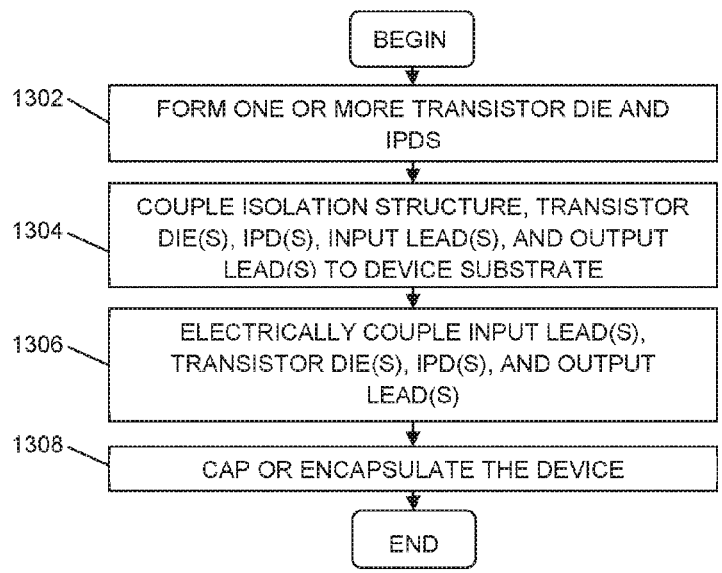
FIG. 13 is a flowchart of a method of manufacturing a packaged RF device, in accordance with an example embodiment.

FIG. 13 is a flowchart of a method of manufacturing a packaged RF device (e.g., device 500, 1200, FIGS. 5, 12), in accordance with an example embodiment. The method may begin, in block 1302, by forming various components of the device, including forming one or more transistor die (e.g., die 530, 531, 1230, 1231, FIGS. 5, 12) and forming one or more IPDs (e.g., IPDs 510, 511, 800, 1000, 1100, 1208-1211, FIGS. 5, 8, and 10-12). In various embodiments, the IPDs include first and second shunt capacitors (e.g., corresponding to first and second shunt capacitors 414, 424, FIG. 4).

In block 1304, for an air cavity embodiment, an isolation structure (e.g., isolation structure 508, FIG. 5) is coupled to a device substrate (e.g., flange 506, 1206, FIGS. 5, 12). In addition, the transistor die (e.g., die 530, 531, 1230, 1231, FIGS. 5, 12) and IPD(s) (e.g., IPDs 510, 511, 800, 1000, 1100, 1208-1211, FIGS. 5, 8, and 10-12) are coupled to a portion of the top surface of the substrate that is exposed through an opening in the isolation structure (e.g., the active device area). Leads (e.g., input and output leads 502, 504, 1202, 1204, FIGS. 5, 12) are coupled to the top surface of the isolation structure (e.g., to metallization on the top surface of the isolation structure). For overmolded (e.g., encapsulated) device embodiments, the isolation structure may be excluded, and the substrate and leads may form portions of a leadframe.

In block 1306, the input lead(s), transistor die(s), IPD(s), and output lead(s) are electrically coupled together. As discussed in detail previously, the electrical connections may be made using bondwires between the various device components and elements. Finally, in block 1308, the device is capped (e.g., with cap 610, FIG. 6) or encapsulated (e.g., with mold compound, not illustrated). The device may then be incorporated into a larger electrical system.

An embodiment of a packaged RF amplifier device includes a package substrate, an input lead coupled to the package substrate, a transistor die coupled to a top surface of the package substrate, a first input circuit, and a second input circuit. The transistor die includes a transistor having a control terminal. The first input circuit is electrically coupled between the input lead and the control terminal. The first input circuit includes a first series inductance with a first inductance value coupled between the input lead and a first node, a second series inductance with a second inductance value coupled between the first node and the control terminal, and a first shunt capacitance with a first capacitance value coupled between the first node and a ground reference. The second input circuit is electrically coupled between the input lead and the ground reference. The second input circuit includes a first shunt inductance with a third inductance value coupled between the input lead and a second node, and a second shunt capacitance with a second capacitance value coupled between the second node and the ground reference.

An embodiment of a method of manufacturing a packaged RF amplifier device includes coupling a transistor die to a top surface of a package substrate, where the transistor die includes a transistor having a control terminal. The method further includes electrically coupling a first input circuit between an input lead and the control terminal, where the first input circuit includes a first series inductance with a first inductance value coupled between the input lead and a first node, a second series inductance with a second inductance value coupled between the first node and the control terminal, and a first shunt capacitance with a first capacitance value coupled between the first node and the ground reference. The method further includes electrically coupling a second input circuit between the input lead and the ground reference, where the second input circuit includes a first shunt inductance with a third inductance value coupled between the input lead and a second node, and a second shunt capacitance with a second capacitance value coupled between the second node and the ground reference.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
a package substrate;
an input lead coupled to the package substrate;
a transistor die coupled to a top surface of the package substrate, the transistor die including a transistor having a control terminal;
a first input circuit electrically coupled between the input lead and the control terminal, wherein the first input circuit includes
a first series inductance with a first inductance value coupled between the input lead and a first node,
a second series inductance with a second inductance value coupled between the first node and the control terminal, and
a first shunt capacitance with a first capacitance value coupled between the first node and a ground reference; and
a second input circuit electrically coupled between the input lead and the ground reference, wherein the second input circuit includes
a first shunt inductance with a third inductance value coupled between the input lead and a second node, wherein the first shunt inductance is directly connected to the input lead, and
a second shunt capacitance with a second capacitance value coupled between the second node and the ground reference.

2. The device of claim 1, wherein:
the first input circuit and the second input circuit provide impedance matching between the input lead and the transistor die at a fundamental frequency of operation of the RF amplifier device; and
the second inductance value and the first capacitance value are selected so that the second series inductance and the first shunt capacitance present a short circuit to the ground reference for RF energy at a second harmonic of the fundamental frequency of operation.

3. A packaged radio frequency (RF) amplifier device comprising:
a package substrate;
an input lead coupled to the package substrate;
a transistor die coupled to a top surface of the package substrate, the transistor die including a transistor having a control terminal;
a first passive device substrate coupled to a top surface of the package substrate between the input lead and the transistor die, wherein a first node, a second node, a first shunt capacitance, and a second shunt capacitance are integrated within or coupled to the first passive device substrates;
a first input circuit electrically coupled between the input lead and the control terminal, wherein the first input circuit includes
a first series inductance with a first inductance value coupled between the input lead and the first node, wherein the first series inductance comprises a first plurality of bondwires coupled between the input lead and the first node,
a second series inductance with a second inductance value coupled between the first node and the control terminal, wherein the second series inductance comprises a second plurality of bondwires coupled between the first node and the control terminal, and
the first shunt capacitance with a first capacitance value coupled between the first node and a ground reference; and
a second input circuit electrically coupled between the input lead and the ground reference, wherein the second input circuit includes
a first shunt inductance with a third inductance value coupled between the input lead and the second node, wherein the first shunt inductance comprises a third plurality of bondwires coupled between the input lead and the second node, and
the second shunt capacitance with a second capacitance value coupled between the second node and the ground reference.

4. The device of claim 3, wherein the first passive device substrate is selected from a semiconductor substrate, a printed circuit board, and a ceramic substrate.

5. The device of claim 3, wherein:
the first shunt capacitor is located in a central portion of the first passive device substrate; and
the second shunt capacitor is located in one or more edge portions of the first passive device substrate.

6. The device of claim 3, wherein:
the first shunt capacitor is located proximate to a first side of the first passive device substrate; and
the second shunt capacitor is located proximate to a second side of the first passive device substrate that is opposite the first side.

7. The device of claim 3, wherein:
the transistor includes a plurality of transistor cells, wherein each transistor cell is coupled between one of a plurality of control terminal pads and a first current carrying terminal of the transistor,
the first node includes a plurality of first node pads,
the first shunt capacitor includes a plurality of first sub-capacitors, wherein each of the first sub-capacitors has a first electrode and a second electrode, wherein the second electrode of each of the first sub-capacitors is coupled to the ground reference, and
each first node pad is electrically coupled to the first electrode of one of the first sub-capacitors.

8. The device of claim 7, wherein
the first shunt capacitor is located in a central portion of the first passive device substrate; and
the second shunt capacitor is located in one or more edge portions of the first passive device substrate.

9. The device of claim 7, wherein
the second node includes a plurality of second node pads,
the second shunt capacitor includes a plurality of second sub-capacitors, wherein each of the second sub-capacitors has a first electrode and a second electrode, wherein the second electrode of each of the second sub-capacitors is coupled to the ground reference, and
each second node pad is electrically coupled to the first electrode of one of the second sub-capacitors.

10. The device of claim 9, wherein the first sub-capacitors and the second sub-capacitors are interleaved with each other.

11. The device of claim 3, wherein the first shunt capacitance and the second shunt capacitance are integrally formed with the first passive device substrate.

12. The device of claim 11, wherein the first shunt capacitance and the second shunt capacitance comprise Metal Oxide Semiconductor capacitors (MOScaps).

13. The device of claim 3, wherein the first shunt capacitance and the second shunt capacitance include discrete capacitors that are coupled to the first passive device substrate.

14. The device of claim 1, further comprising:
a first passive device substrate coupled to a top surface of the package substrate between the input lead and the transistor die, wherein the first node and the first shunt capacitance are integrated within or coupled to the first passive device substrate; and
a second passive device substrate coupled to a top surface of the package substrate between the input lead and the transistor die, wherein the second node and the second shunt capacitance are integrated within or coupled to the second passive device substrate, and wherein
the first series inductance comprises a first plurality of bondwires coupled between the input lead and the first node,
the second series inductance comprises a second plurality of bondwires coupled between the first node and the control terminal, and
the first shunt inductance comprises a third plurality of bondwires coupled between the input lead and the second node.

15. A method of manufacturing a packaged radio frequency (RF) amplifier device, the method comprising the steps of:
coupling a transistor die to a top surface of a package substrate, the transistor die including a transistor having a control terminal;
electrically coupling a first input circuit between an input lead and the control terminal, wherein the first input circuit includes
a first series inductance with a first inductance value coupled between the input lead and a first node,
a second series inductance with a second inductance value coupled between the first node and the control terminal, and
a first shunt capacitance with a first capacitance value coupled between the first node and the ground reference; and
electrically coupling a second input circuit between the input lead and the ground reference, wherein the second input circuit includes
a first shunt inductance with a third inductance value coupled between the input lead and a second node, wherein the first shunt inductance is directly connected to the input lead, and
a second shunt capacitance with a second capacitance value coupled between the second node and the ground reference.

16. The method of claim 15, wherein:
the first input circuit and the second input circuit provide impedance matching between the input lead and the transistor die at a fundamental frequency of operation of the RF amplifier device; and
the second inductance value and the first capacitance value are selected so that the second series inductance and the first shunt capacitance present a short circuit to the ground reference for RF energy at a second harmonic of the fundamental frequency of operation.

17. A method of manufacturing a packaged radio frequency (RF) amplifier device, the method comprising the steps of:
coupling a transistor die to a top surface of a package substrate, the transistor die including a transistor having a control terminal;
coupling a first passive device substrate to the top surface of the package substrate between an input lead and the transistor die, wherein a first node, a second node, a first shunt capacitance, and a second shunt capacitance are integrated within or coupled to the first passive device substrate;
electrically coupling a first input circuit between an input lead and the control terminal, wherein the first input circuit includes
a first series inductance with a first inductance value coupled between the input lead and a first node, and electrically coupling the first series inductance includes coupling a first plurality of bondwires between the input lead and the first node, wherein the first series inductance is formed from the first plurality of bondwires,
a second series inductance with a second inductance value coupled between the first node and the control terminal, and electrically coupling the second series inductance includes coupling a second plurality of bondwires between the first node and the control terminal, wherein the second series inductance is formed from the second plurality of bondwires, and
the first shunt capacitance with a first capacitance value coupled between the first node and the ground reference; and
electrically coupling a second input circuit between the input lead and the ground reference, wherein the second input circuit includes
a first shunt inductance with a third inductance value coupled between the input lead and a second node, and electrically coupling the first shunt inductance includes coupling a third plurality of bondwires between the input lead and the second node, wherein the first shunt inductance is formed from the third plurality of bondwires, and
the second shunt capacitance with a second capacitance value coupled between the second node and the ground reference.

18. The method of claim 17, wherein the first passive device substrate is selected from a semiconductor substrate, a printed circuit board, and a ceramic substrate.

19. The method of claim 17, wherein the first shunt capacitance and the second shunt capacitance are integrally formed with the first passive device substrate.

20. The method of claim 15, wherein:
electrically coupling the first input circuit includes
coupling a first passive device substrate to a top surface of the package substrate between the input lead and the transistor die, wherein the first node and the first shunt capacitance are integrated within or coupled to the first passive device substrate,
coupling a first plurality of bondwires between the input lead and the first node, wherein the first series inductance is formed from the first plurality of bondwires, and
coupling a second plurality of bondwires between the first node and the control terminal, wherein the second series inductance is formed from the second plurality of bondwires; and
electrically coupling the second input circuit includes
coupling a second passive device substrate to a top surface of the package substrate between the input lead and the transistor die, wherein the second node and the second shunt capacitance are integrated within or coupled to the second passive device substrate, and coupling a third plurality of bondwires between the input lead and the second node, wherein the first shunt inductance is formed from the third plurality of bondwires.

* * * * *